United States Patent

Yamagishi et al.

(12)
(10) Patent No.: US 7,132,040 B2
(45) Date of Patent: Nov. 7, 2006

(54) MATCHING UNIT FOR SEMICONDUCTOR PLASMA PROCESSING APPARATUS

(75) Inventors: Etsuo Yamagishi, Osaka (JP); Yukio Sato, Osaka (JP); Taku Fukada, Osaka (JP); Katsumi Takahashi, Osaka (JP)

(73) Assignee: Pearl Kogyo Co., Ltd., Osaka (JP)

( * ) Notice: Subject to any disclaimer, the term of this patent is extended or adjusted under 35 U.S.C. 154(b) by 442 days.

(21) Appl. No.: 10/790,074

(22) Filed: Mar. 2, 2004

(65) Prior Publication Data

US 2005/0098116 A1    May 12, 2005

(30) Foreign Application Priority Data

Nov. 10, 2003    (JP)    ............... 2003-379869

(51) Int. Cl.
C23C 14/00    (2006.01)
C23C 16/00    (2006.01)
C23F 1/02    (2006.01)

(52) U.S. Cl. ............ 204/298.08; 204/298.01; 156/345.44; 156/345.47; 156/345.48; 118/723 I

(58) Field of Classification Search ............... None
See application file for complete search history.

(56) References Cited

U.S. PATENT DOCUMENTS 5,077,499 A * 12/1991 Oku ............... 315/111.21

2002/0134508 A1 * 9/2002 Himori et al. ........ 156/345.44

FOREIGN PATENT DOCUMENTS

JP    07-159562 A    6/1995

* cited by examiner

*Primary Examiner*—Tuyet Thi Vo
(74) *Attorney, Agent, or Firm*—Birch, Stewart, Kolasch & Birch, LLP

(57) ABSTRACT

This matching unit is used for a semiconductor plasma processing apparatus supplying high-frequency power via feeding line to an electrode provided in a chamber, and includes first and second variable capacitors, and a distributed constant circuit, which is structured by copper plates connected between an electrode of the second variable capacitor and an end of an internal conductor of the feeding line and the like. The distributed constant circuit and the feeding line delay the phase of a high-frequency voltage by ½ wavelength. Therefore, the same state as those when the electrode of the second variable capacitor and the electrode inside the chamber are directly connected can be realized, and matching is easily attained.

4 Claims, 3 Drawing Sheets

MATCHING UNIT FOR SEMICONDUCTOR PLASMA PROCESSING APPARATUS

This nonprovisional application is based on Japanese Patent Application No. 2003-379869 filed with the Japan Patent Office on Nov. 10, 2003, the entire contents of which are hereby incorporated by reference.

BACKGROUND OF THE INVENTION

1. Field of the Invention

The present invention relates to a matching unit, and specifically, to a matching unit used for a semiconductor plasma processing apparatus.

2. Description of the Background Art

A semiconductor plasma processing apparatus is an apparatus for processing a semiconductor substrate by plasma, which is generated by applying high-frequency power between a pair of electrodes provided in a chamber. In the semiconductor plasma processing apparatus, a matching unit is provided between a high-frequency power supply and the electrodes in order to suppress reflection of high-frequency power. Additionally, in order to facilitate impedance matching, the matching unit is directly fixed to the outer wall of the chamber, and the distance between the matching unit and the electrodes is designed to be minimum.

There is also a technique for matching impedance in a high-frequency heating apparatus including an antenna for receiving high-frequency power via a coaxial feeding line to be provided to plasma, and a stub provided at one point of the length of the coaxial feeding line. Here, the length of the coaxial feeding line is set to a length in which the length required for matching the impedance from the antenna to the stub is added to an integral multiple of a half wavelength of the high frequency, and the length of the stub up to the shorting end thereof is set to a length in which the length required for impedance matching is added to an integral multiple of a half wavelength of the high frequency. Thus, the frequency of high-frequency power is controlled to match the impedance of the coaxial feeding line and that of the antenna (for example, see Japanese Patent Laying-Open No. 7-159562).

As above, in a semiconductor plasma processing apparatus, generally a matching unit is directly fixed to the outer wall of a chamber. However, the apparatus of some type may require arranging the matching unit distanced from the chamber. In such a case, it is difficult to attain matching since the wiring between the matching unit and the electrodes becomes longer and the inductance of the wiring becomes greater.

SUMMARY OF THE INVENTION

Therefore, a principle object of the present invention is to provide a matching unit that can easily attain matching even when the distance between the matching unit and the electrodes is long.

A matching unit according to the present invention used for a semiconductor plasma processing apparatus including an electrode provided inside a chamber and a feeding line having its one terminal connected to the electrode and having its other terminal arranged outside the chamber includes: a first capacitor receiving a high-frequency voltage at its one electrode and receiving a reference voltage at its other electrode, a capacitance value of the first capacitor being adjustable; a second capacitor receiving the high-frequency voltage at its one electrode, a capacitance value of the second capacitor being adjustable; and a distributed constant circuit connected between other electrode of the second capacitor and the other terminal of the feeding line for delaying a phase of the high-frequency voltage by a length substantially equal to a length in which a length of the feeding line is subtracted from a natural number multiple of ½ wavelength of the high-frequency voltage.

In the matching unit according to the present invention, the distributed constant circuit is provided, which is connected between other electrode of the second capacitor and the other terminal of the feeding line for delaying a phase of the high-frequency voltage by a length substantially equal to a length in which a length of the feeding line is subtracted from a natural number multiple of ½ wavelength of the high-frequency voltage. Accordingly, the phase of the high-frequency voltage is delayed by a length substantially equal to a natural number multiple of ½ wavelength between the other terminal of the second capacitor and the electrode, and the impedance between them becomes substantially 0. Therefore, matching is easily attained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
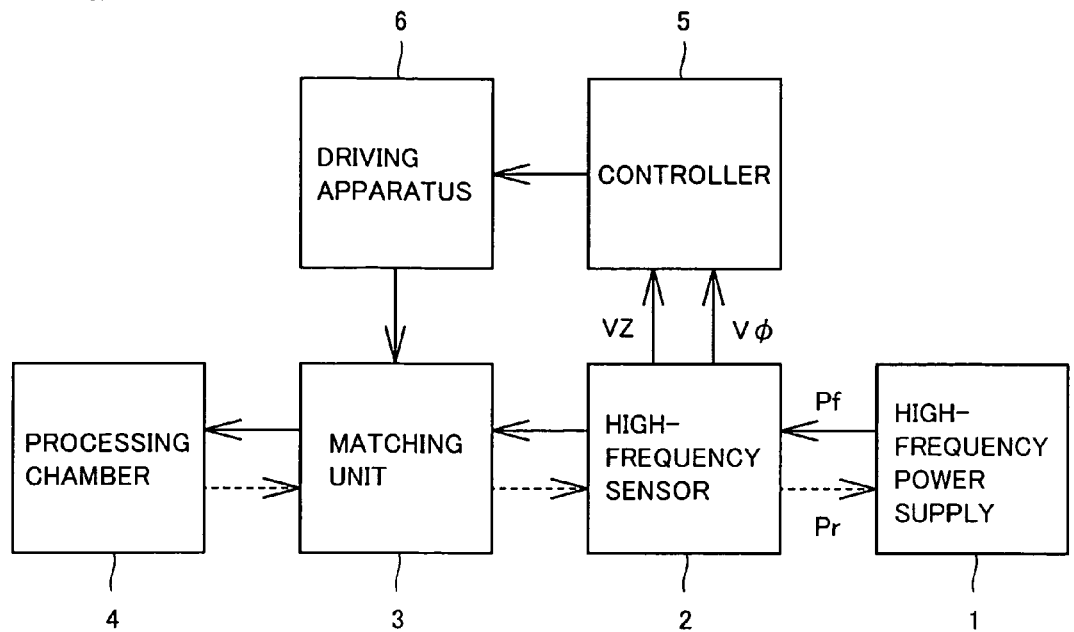
FIG. 1 is a block diagram showing the configuration of a semiconductor plasma processing apparatus according to a first embodiment of the present invention.

FIG. 1 is a block diagram showing the configuration of a semiconductor plasma processing apparatus according to the first embodiment of the present invention. In FIG. 1, the semiconductor plasma processing apparatus includes a high-frequency power supply 1, a high-frequency sensor 2, a matching unit 3, a processing chamber 4, a controller 5, and a driving apparatus 6.

High-frequency power supply 1 generates prescribed high-frequency power. This high-frequency power has a prescribed frequency between 60 MHz and 500 MHz (herein it is assumed to be 100 MHz). The high frequency power generated by high-frequency power supply 1 is provided to processing chamber 4 via high-frequency sensor 2 and matching unit 3. The high-frequency power partially reflects at processing chamber 4, and progressive wave power Pf and reflected wave power Pr are generated in a feeding line (not shown).

High-frequency sensor 2 detects voltage V and current I of the feeding line between high-frequency power supply 1 and matching unit 3, and based on the detected result, outputs a signal VZ corresponding to the deviation of a ratio Z of voltage V and current I from characteristic impedance Z0 (for example, 50 ohm), and a signal Vφ having a level proportional to the phase difference φ between voltage V and current I.

Matching unit 3 minimizes reflected power wave Pr by equalizing the impedance seen from its input terminal side toward processing chamber 4 side with characteristic impedance Z0 of the feeding line between high-frequency power supply 1 and matching unit 3. The impedance of matching unit 3 is controllable. This matching unit will be described in detail later.

Driving apparatus 6 includes a motor, a gear and the like, and drives matching unit 3 in accordance with controller 5. Controller 5 adjusts the impedance of matching unit 3 through driving apparatus 6 such that the levels of signals VZ and Vφ from high-frequency sensor 2 are each minimized.

Figure 2:
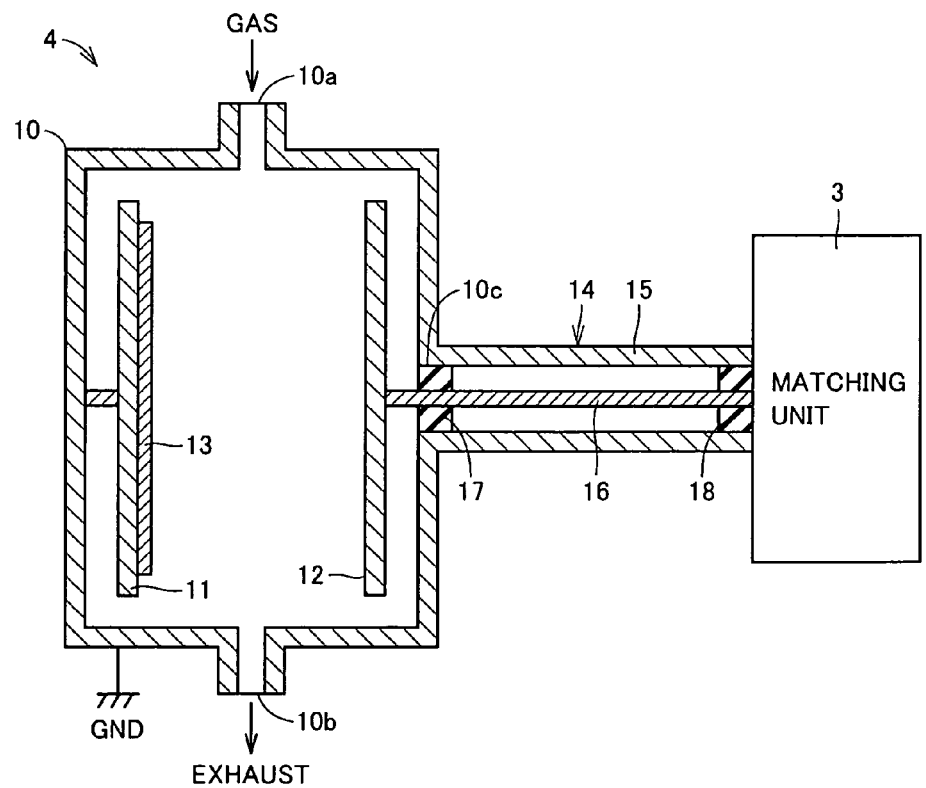
FIG. 2 is a cross-sectional view showing the configuration of a processing chamber shown in FIG. 1.

As shown in FIG. 2, processing chamber 4 includes a chamber 10, which is provided with a gas supply port 10a and a exhaust port 10b. Gas supply port 10a is connected to a gas supplying apparatus (not shown) that includes a gas flow rate controller, a valve, a gas cylinder and the like, while exhaust port 10b is connected to a gas evacuating apparatus (not shown) that includes a valve, a vacuum pump, and a gas processing apparatus and the like. By the gas supplying apparatus and the gas evacuating apparatus, a desired low pressure can be attained inside chamber 10.

Inside chamber 10, for example two parallel plate electrodes 11 and 12 are provided. One electrode 11 of the two electrodes 11 and 12 is, for example, grounded, while other electrode 12 receives a high-frequency voltage from high-frequency power supply 1. Chamber 10 is grounded. On the surface of electrode 11, a semiconductor substrate 13 is set.

Further, chamber 10 is provided with a feeding port 10c, which is connected to matching unit 3 through feeding line 14. Feeding line 14 includes a cylindrical external conductor 15 and a bar-shaped internal conductor 16. Internal conductor 16 has a prescribed length (herein assumed to be 60 cm). One end of external conductor 15 is electrically connected to the shield case of matching unit 3, while the other end of external conductor 15 is joined to outer periphery of feeding port 10c of chamber 10. One end of internal conductor 16 receives the output voltage of matching unit 3, while the other end of internal conductor 16 passes through feeding port 10c to be connected to electrode 12. Between external conductor 15 and internal conductor 16, a ring-shaped insulating members 17 and 18 are interposed. Insulating member 17 seals between the space of chamber 10 and the space of feeding line 14. The space between external conductor 15 and internal conductor 16 is maintained at normal atmospheric pressure to prevent discharge.

When performing etching or forming a film, first, air is evacuated from chamber 10 by the gas evacuating apparatus. Then, a prescribed gas is introduced into chamber 10 at a prescribed flow rate by the gas supplying apparatus and the evacuation rate of the gas evacuating apparatus is adjusted, such that chamber 10 is adjusted to a prescribed pressure.

Next, high-frequency power supply 1 is turned on to provide prescribed high-frequency power to processing chamber 4, and gas between electrodes 7 and 8 is ionized to enter the plasma state. At this time, the impedance of matching unit 3 is controlled by high-frequency sensor 2, controller 5 and driving apparatus 6 such that reflected wave power Pr is minimized. When gas for etching (for example, CF4) is used, the surface of substrate 13 is etched, and when gas for film-formation (for example SiH4) is used, then a film is deposited on the surface of substrate 13.

Figure 3:
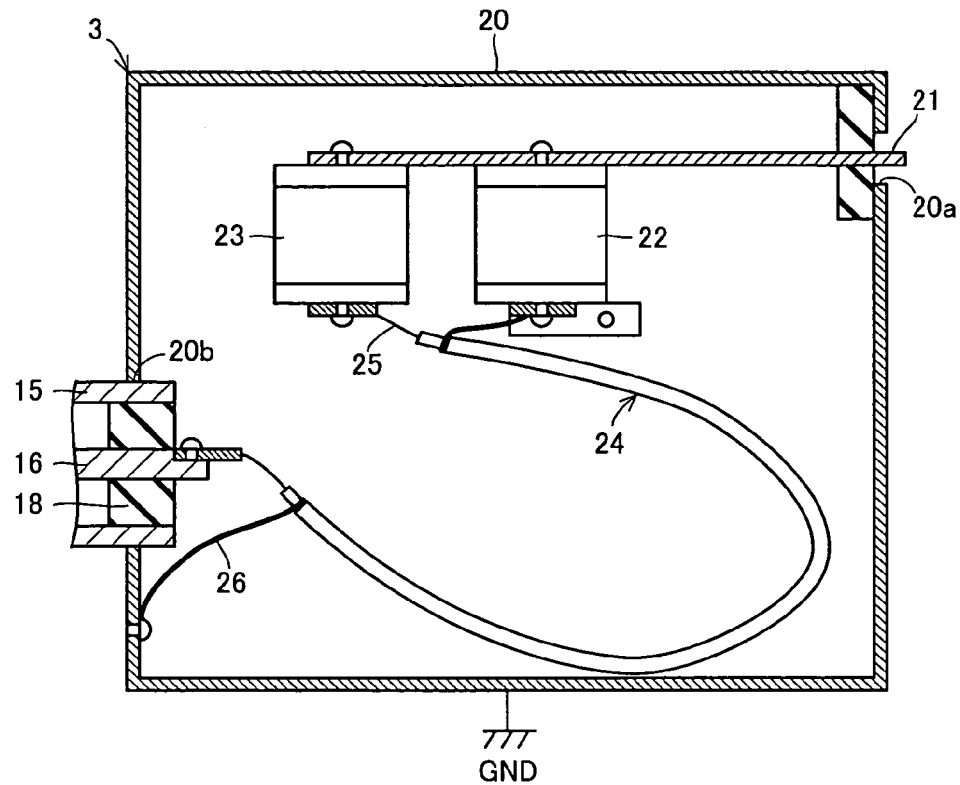
FIG. 3 is a cross-sectional view showing the configuration of a matching unit shown in FIG. 1.

FIG. 3 is a cross-sectional view showing the configuration of matching unit 3. In FIG. 3, matching unit 3 includes a shield case 20. Shield case 20 is a box of rectangular parallelepiped made of aluminum plate, and grounded. Shield case 20 is provided with an input port 20a and an output port 20b. An input terminal 21 is provided to input port 20a, while an end of feeding line 14 is inserted into output port 20b. Input terminal 21 is connected to high-frequency power supply 1 through high-frequency sensor 2.

Inside shield case 20, a variable capacitor 22 for impedance matching, a variable capacitor 23 for phase matching, and a coaxial line 24 forming a distributed constant circuit are provided. Each of capacitors 22 and 23 is coupled to driving apparatus 6 through a driving shaft (not shown), with each capacitance changing in a prescribed range according to the rotation angle of the driving shaft. One electrodes of capacitors 22 and 23 are both connected to an input terminal. The other electrode of capacitor 22 is connected to the inner wall of shield case 20 and grounded.

Coaxial line 24 includes an internal conductor 25 and an external conductor 26. One end of internal conductor 25 is connected to the other electrode of capacitor 23, while the other end thereof is connected to an end of internal conductor 16 of feeding line 14. One end of external conductor 26 is connected to the other electrode of capacitor 22 and grounded, while the other end thereof is connected to the inner wall of shield case 20 and grounded.

Here, according to the theory of the high-frequency circuit, when a high-frequency power supply and a load circuit are connected with a line, of which length is an integral multiple of ½ wavelength of the high-frequency voltage, the result will be the same as those obtained when the load circuit is directly connected to the high-frequency power supply without using the line. Thus, according to the present invention, the other terminal of capacitor 23 and an end of internal conductor 16 of feeding line 14 are connected with a line, of which length is substantially equal to a length in which the length of internal conductor 16 of feeding line 14 is subtracted from a natural number multiple of ½ wavelength (herein assumed to be multiplied by 1) of a high-frequency voltage.

In other words, when the high frequency power supply and the load circuit are connected with a line that delays the phase of high-frequency voltage by an angle of an integral multiple of 180 degrees, the result will be the same as those obtained when the load circuit is directly connected to the high-frequency power supply without using the line. Thus, according to the present invention, the other terminal of capacitor 23 and an end of internal conductor 16 of feeding line 14 are connected with a line having an angle of delay substantially equal to a length in which an angle of delay caused by internal conductor 16 of feeding line 14 is subtracted from a natural number multiple of 180 degrees (herein assumed to be multiplied by 1).

Specifically, ½ wavelength of a high-frequency voltage of 100 MHz can be obtained by the speed of light ($3 \times 10^8$ m/s) divided by 100 MHz×2, which equals 150 cm. Subtracting the length of internal conductor 16 (60 cm) of feeding line 14 from 150 cm equals 90 cm. As coaxial line 24 is filled with a dielectric material between internal conductor 25 and external conductor 26, coaxial line 24 has a shortening rate of ($1/\sqrt{\varepsilon} \approx 2/3$). 90 cm multiplied by the shortening rate (⅔) of coaxial line 24 equals 60 cm. Thus, according to the first embodiment, coaxial line 24 of 60 cm was employed to connect the other electrode of capacitor 23 and an end of internal conductor 16 of feeding line 14. Thus, the same state as those obtained when the other electrode of capacitor 23 is directly connected to electrode 12 in chamber 10 can be realized, and matching is easily attained. Needless to say, the length of coaxial line 24 may not necessarily be exactly 60 cm in the case above and matching can be attained with coaxial line 24 of 50–70 cm, by adjusting each capacitance of capacitors 22 and 23.

Second Embodiment

Figure 4:
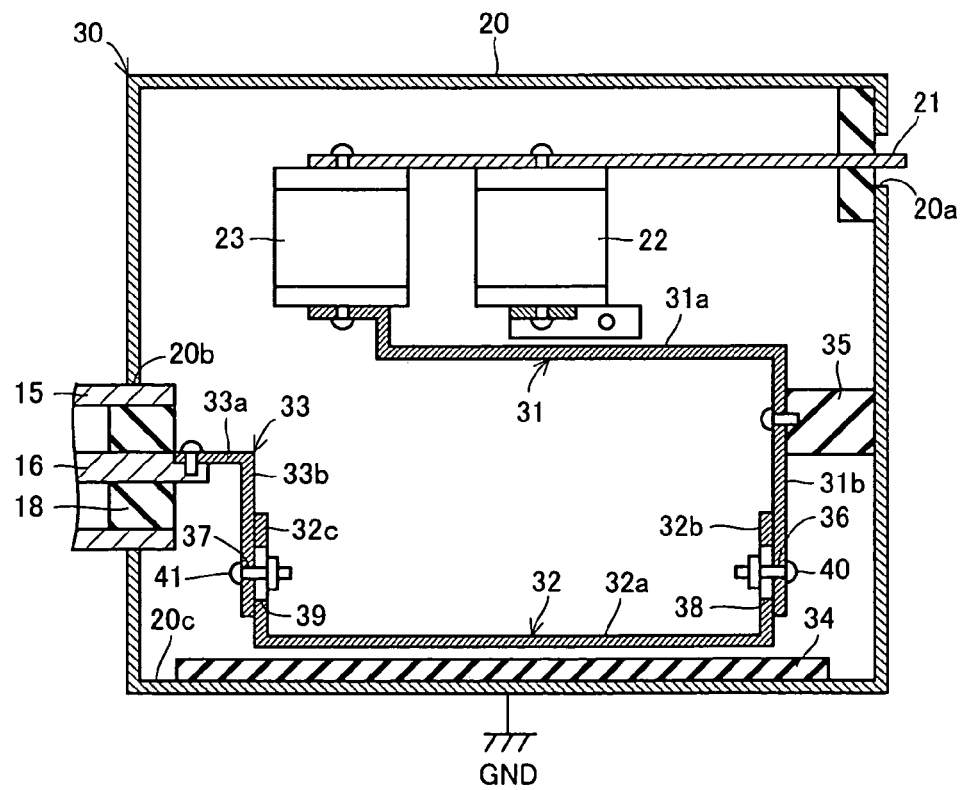
FIG. 4 is a cross-sectional view showing the configuration of a matching unit according to a second embodiment of the present invention.

FIG. 4 is a cross-sectional view showing the configuration of a matching unit 30 used in a semiconductor plasma processing apparatus according to the second embodiment of the present invention. In FIG. 4, matching unit 30 is different from matching unit 3 of FIG. 3 in that coaxial line 24 is replaced by copper plates 31–33 and a dielectric sheet 34. Copper plates 31–33, dielectric sheet 34 and shield case 20 constitute a distributed constant circuit. Each of copper plates 31–33 has a prescribed width between 5 cm to 6 cm (for example, 5.5 cm).

Copper plate 31 is bent to be in an L-shape. One piece 31*a* of copper plate 31 is provided horizontally and having its end connected to the other electrode of capacitor 23. Other piece 31*b* of copper plate 31 is provided vertically, and fixed to the inner wall of shield case 20 through an insulating member 35. To an end of other piece 31*b* of copper plate 31, a screw hole 36 is formed. Copper plate 33 is bent to be in an L-shape. One piece 33*a* of copper plate 33 is provided horizontally and having its end connected to an end of internal conductor 16 of feeding line 14. Other piece 33*b* of copper plate 33 is provided vertically, and a screw hole 37 is formed to an end thereof.

Figure 5:
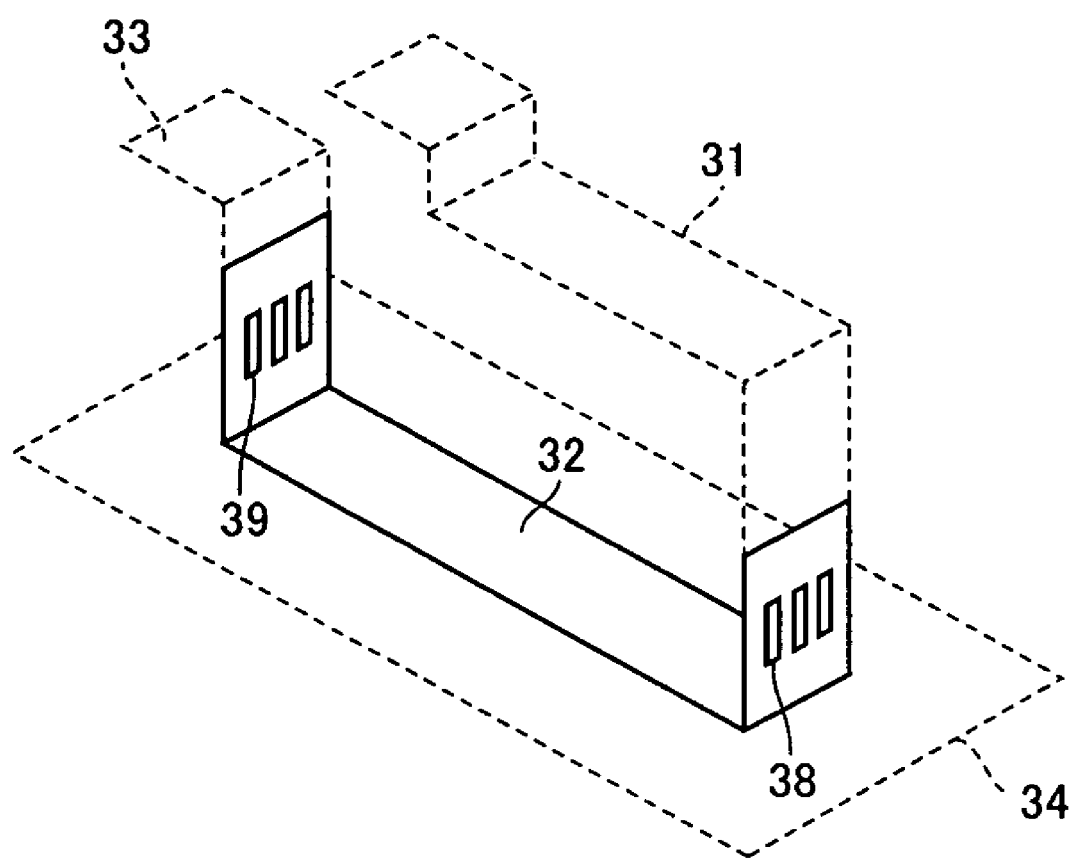
FIG. 5 is a perspective view showing the configuration of a copper plate shown in FIG. 4.

Opposing ends of copper plate 32 are each bent at the right angle. Central portion 32*a* of copper plate 32 is arranged horizontally above a floor portion 20*c* of shield case 20. To one end 32*b* of copper plate 32, as shown in FIG. 5, a long hole 38 is formed in a vertical direction. To other end 32*c* of copper plate 32, a long hole 39 is formed in a vertical direction. Other piece 31*b* of copper plate 31 and one end 32*b* of copper plate 32 are fixed by a screw 40 penetrating through screw hole 36 and long hole 38. Other piece 33*b* of copper plate 33 and other end 32*c* of copper plate 32 are fixed by a screw 41 penetrating through screw hole 37 and long hole 39.

Screw hole 36, long hole 38 and screw 40 are provided in a plurality of sets (three sets in FIG. 5), and screw hole 37, long hole 39 and screw 41 are provided in a plurality of sets (three sets in FIG. 5). By adjusting the relative positions of screw hole 36 and long hole 38, and the relative positions of screw hole 37 and long hole 39, and then fixing screws, adjustment of the distance (capacitance) between central portion 32*a* of copper plate 32 and floor portion 20*c* of shield case 20 as well as adjustment of the length (inductance) of the line formed by copper plates 31–33 can be achieved, and thus adjustment of the circuit constant of the distributed constant circuit can be achieved.

Dielectric sheet 34 is placed on floor portion 20*c* of shield case 20. Dielectric sheet 34 is provided to increase the capacitance between central portion 32*a* of copper plate 32 and floor portion 20*c* of shield case 20, to withstand voltage, and to obtain the above described shortening rate such that copper plates 31–33 are reduced in length.

The length of copper plates 31–33 connected by screws 40 and 41 is set to 60 cm, which is the same as that of coaxial line 24 shown in FIG. 3. Thus, the same state as those obtained when the other electrode of capacitor 23 is directly connected to electrode 12 in chamber 10 can be realized, and matching is easily attained. Further, as the distributed constant circuit is structured by copper plates 31–33, powers can be provided in greater amount as compared to the first embodiment where the distributed constant circuit is structured by coaxial line 24.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A matching unit used for a semiconductor plasma processing apparatus including an electrode provided inside a chamber and a feeding line having its one terminal connected to said electrode and having its other terminal arranged outside said chamber, comprising:
 a first capacitor receiving a high-frequency voltage at its one electrode and receiving a reference voltage at its other electrode, a capacitance value of said first capacitor being adjustable;
 a second capacitor receiving said high-frequency voltage at its one electrode, a capacitance value of said second capacitor being adjustable; and
 a distributed constant circuit connected between other electrode of said second capacitor and the other terminal of said feeding line for delaying a phase of said high-frequency voltage by a length substantially equal to a length in which a length of said feeding line is subtracted from a natural number multiple of ½ wavelength of said high-frequency voltage.

2. The matching unit according to claim 1, wherein
 said distributed constant circuit includes a coaxial line of a prescribed length connected between the other electrode of said second capacitor and the other terminal of said feeding line.

3. The matching unit according to claim 1, further comprising
 a shield case accommodating said first capacitor, said second capacitor and said distributed constant circuit, wherein
 said distributed constant circuit includes
 a metal plate of a prescribed length connected between the other electrode of said second capacitor and the other terminal of said feeding line, at least part of said metal plate being provided facing to an inner wall of said shield case, and
 a dielectric member arranged between said at least part of said metal plate and said inner wall of said shield case.

4. The matching unit according to claim 3, wherein
 said distributed constant circuit further includes an adjusting portion for adjusting a distance between said at least part of said metal plate and said inner wall of said shield case and/or the length of said metal plate.

* * * * *